(12) United States Patent
LaCroix et al.

(10) Patent No.: US 8,586,982 B2
(45) Date of Patent: Nov. 19, 2013

(54) SEMICONDUCTOR TEST CHIP DEVICE TO MIMIC FIELD THERMAL MINI-CYCLES TO ASSESS RELIABILITY

(75) Inventors: Luke D. LaCroix, Williston, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 711 days.

(21) Appl. No.: 12/862,844

(22) Filed: Aug. 25, 2010

(65) Prior Publication Data
US 2012/0049874 A1 Mar. 1, 2012

(51) Int. Cl.
*H01L 23/58* (2006.01)
*G01R 31/26* (2006.01)

(52) U.S. Cl.
USPC ............ 257/48; 324/750.03; 324/750.06; 324/762.01; 324/762.03; 257/E21.524

(58) Field of Classification Search
USPC .......... 257/48; 324/750.03, 750.06, 762.01, 324/762.03
See application file for complete search history.

(56) References Cited

U.S. PATENT DOCUMENTS

| | | |
|---|---|---|
| 4,216,421 A | 8/1980 | Dupont |
| 5,569,950 A | 10/1996 | Lewis et al. |
| 6,260,998 B1 | 7/2001 | Garfinkel et al. |
| 6,281,573 B1 | 8/2001 | Atwood et al. |
| 6,662,136 B2 | 12/2003 | Lamb et al. |
| 6,931,369 B1 | 8/2005 | Perry et al. |
| 7,098,054 B2 | 8/2006 | Filippi et al. |
| 2004/0130442 A1* | 7/2004 | Breed et al. ............ 340/443 |
| 2005/0227380 A1 | 10/2005 | Filippi et al. |
| 2006/0273460 A1 | 12/2006 | Filippi et al. |
| 2008/0224135 A1 | 9/2008 | Filippi et al. |
| 2009/0016408 A1* | 1/2009 | Doan et al. ............ 374/164 |

FOREIGN PATENT DOCUMENTS

JP 2008224289 9/2008

OTHER PUBLICATIONS

IBM Disclosure AUS920060213US1, "Method and Apparatus for Controlling Heat Generation in a Multi Core Processor," 2 pages, Sep. 2006.

* cited by examiner

*Primary Examiner* — Evan Pert
(74) *Attorney, Agent, or Firm* — Gibb & Riley, LLC; David A. Cain, Esq.

(57) ABSTRACT

A semiconductor test device including a plurality of conductive layers, each of the layers comprising integrated circuit devices, a plurality of insulating layers between the conductive layers, a plurality of heat generating structures positioned between the insulating layers and the conductive layers, each of the heat generating structures being sized and positioned to only heat a predetermined limited area of the plurality of layers, a plurality of thermal monitors positioned within each of the plurality of layers, a control unit operatively connected to the heat generating structures and the thermal monitors, the control unit individually cycling the heat generating structures on and off for multiple heat cycles, such that different areas of the layers are treated to different heat cycles.

20 Claims, 3 Drawing Sheets

SEMICONDUCTOR TEST CHIP DEVICE TO MIMIC FIELD THERMAL MINI-CYCLES TO ASSESS RELIABILITY

BACKGROUND

The present invention relates to a semiconductor chip device, and more specifically, to a device that mimics field thermal mini-cycles to assess reliability due to thermally cycling.

There is a reliability concern of a semiconductor device internal layers cracking, delaminating, and failing external interconnections due to thermal cycling within the internal layers.

Current power management design, as applied to semiconductor devices, results in the creation of a high number of smaller thermal cycles. This type of thermal stress environment, coupled with semiconductor devices including finer ground rules and less robust materials, results in a need to more accurately evaluate the impact of thermal mini-cycles on semiconductor device reliability. Application design has attempted to reduce chip power by designing small power islands on the chip that are controlled by clock gating, voltage islands, and thermal feedback circuits. However, this power island designing creates thousands of mini-cycles and potentially creates a thermal gradient across the chip based on the hot spots of power islands. Generally, the state of the art is unaware of how these types of thermal gradients and mini-cycles affects product reliability of the semiconductor design.

Conventional test techniques involve accelerated thermal stressing where the semiconductor device and the corresponding packaging are cycled through temperature ranges as a total system. This method includes a relatively slow ramp up and ramp down in temperature and does not adequately mimic the thermal environment created by the higher number of localized thermal mini-cycles. Typically, test vehicles have heaters in a metal or interconnect layer to change the chip junction temperature (Tj), but this is not an effective test simulation if an area of concern is a stress area below the heaters, that is, in a different layer than the metal layer.

The embodiments described below provide a test device that more closely emulates the actual operating conditions of the semiconductor structure design cycled in a power management mode that creates heat in the transistor level of the semiconductor chip and allows localized heating/stresses to be created at higher frequencies. Also, sensors that detect the actual junction temperature of the device at a given location of device are provided by embodiments herein rather than one uniform junction temperature across the entire device in a traditional/existing testing methodology.

SUMMARY

According to one embodiment of the present invention, a semiconductor test device includes a plurality of conductive layers, each of the layers comprising integrated circuit devices where a plurality of insulating layers are disposed between the conductive layers. A plurality of heat generating structures are positioned between the insulating layers and the conductive layers, where each of the heat generating structures is sized and positioned to only heat a predetermined limited area of the plurality of layers. Additionally, a plurality of thermal monitors is positioned within each of the plurality of layers, and a control unit is operatively connected to the heat generating structures and the thermal monitors. The control unit individually cycles the heat generating structures on and off for multiple heat cycles, such that different areas of the layers are treated to different heat cycles.

In other embodiments of the present invention, the control unit selectively activates a predetermined pattern of the heat generating structures to selectively create hot spots within the layers. The heat generating structures may include at least one individually controllable power dissipation element, and at least one transistor connected to the power dissipation element, where the transistor controls whether the power dissipation elements generate heat. Each of the thermal monitors may be sized and positioned within the semiconductor test device to only detect temperatures of a second predetermined limited area of the layers. The second predetermined area corresponds to the predetermined area, such that each of the heat generating structures has a corresponding thermal monitor. Additionally, a plurality of second monitors may be positioned within each of the layers to detect one of electrical and mechanical failure, wherein the control unit is operatively connected to the plurality of second monitors. Additionally, a plurality of the control unit, heat generating structures, and monitors may be positioned within each of the layers.

DETAILED DESCRIPTION

A test chip device is disclose herein that more closely emulates a semiconductor product and includes heaters apart from the metal interconnect layer that are located within the transistor level of the semiconductor chip. The embodiments here are more representative of actual working semiconductor cycled in a power management mode when compared to conventional testing structures. With embodiments herein, stresses generated by the test chip device are created at a higher frequency and focused within the semiconductor device (and the primary package-to-device interconnection). For example, one embodiment places a circuit below metal layers in a semiconductor chip to emulate the heat source of a representative component/heat source.

Figure 1:
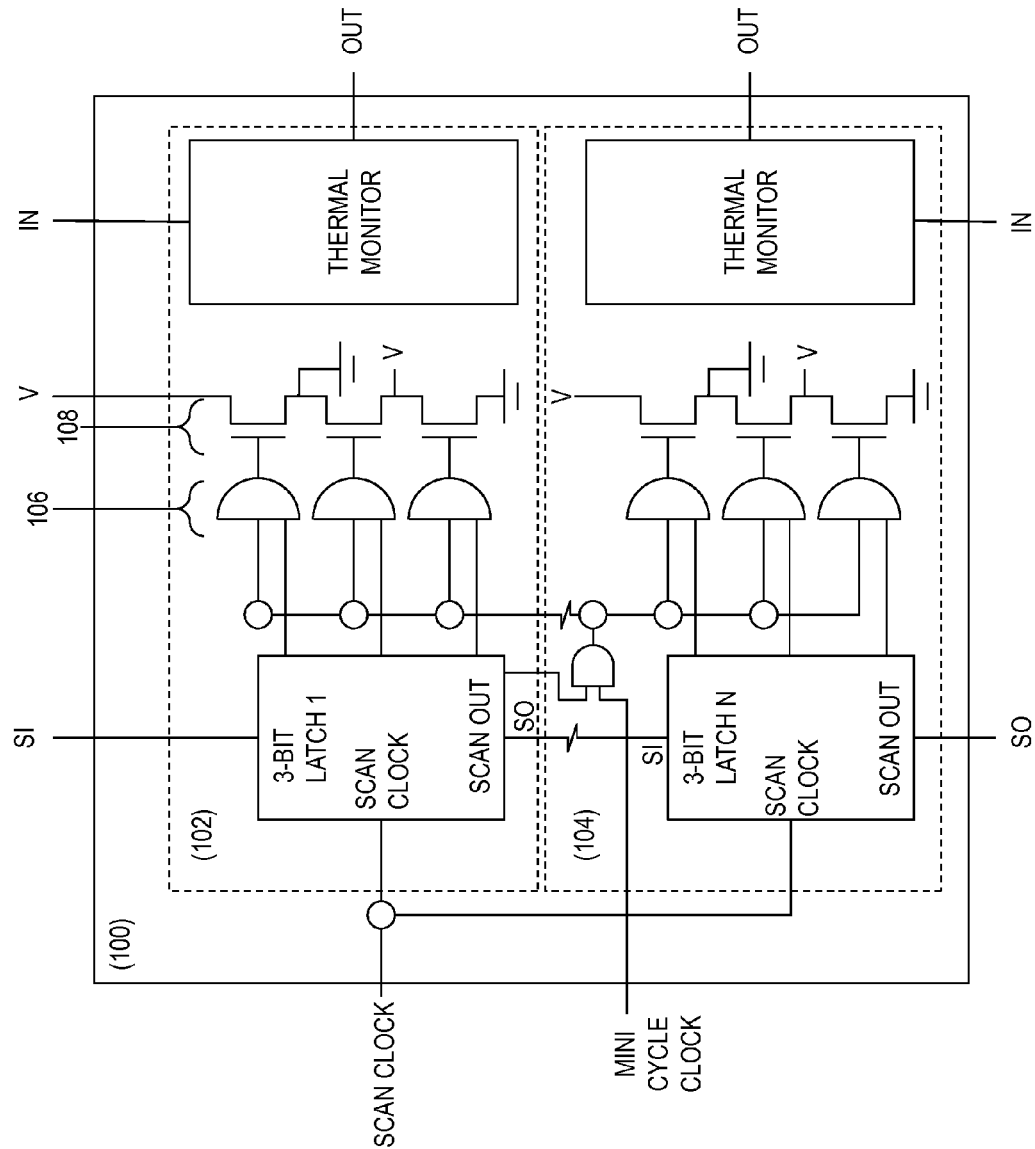
FIG. 1 is a schematic circuit diagram of a system utilized by embodiments herein.

FIG. 1 is a schematic circuit diagram of a system utilized by embodiments herein. More specifically, FIG. 1 illustrates a control circuit diagram 100 including a plurality of individual "kernel" circuits 102 and 104. Each of the kernel circuits 102 and 104 includes a Scan In (SI), a Scan Out (SO), and a Scan Clock signal used to initialize a logic function of a 3-bit latch and AND gate to supply a voltage V to a heat generating element or a plurality of heat generating elements. Kernels 102/104 each include 3-bit latch ⅓-bit latch N that feed a series of AND gates 106 whose outputs are connected to a series of heat generating elements 108 connected to an operating voltage V that powers the heating elements (shown in FIGS. 2-3). Once the logic function is initialized, controlling the pulse width and duty cycle of the Mini Cycle clock controls how much power is generated for each kernel 102/104. To monitor the junction temperature (Tj) of the kernel, one or more thermal monitors are included.

Depending on the power that is needed and the chip size that is to be analyzed, the test chip device would have a number of these 'kernels' spread across the chip and they all could be connected together, or be separated into groups. To connect two kernels together, for example, 102 and 104, the SO of one kernel would connect to the SI of the other kernel and the clocks (Scan & Mini Cycle) are tied in parallel. Thermal monitors can be kept separate for each kernel to allow the thermal monitoring for each individual kernel or they can be connected to latches and scanned out to minimize the number of pins needed on the chip. The programmability of each kernel will allow the analysis of different thermal gradients across the semiconductor chip, and could create localized hot spots to simulate functional products/components having a heat generation signature.

Figure 2:
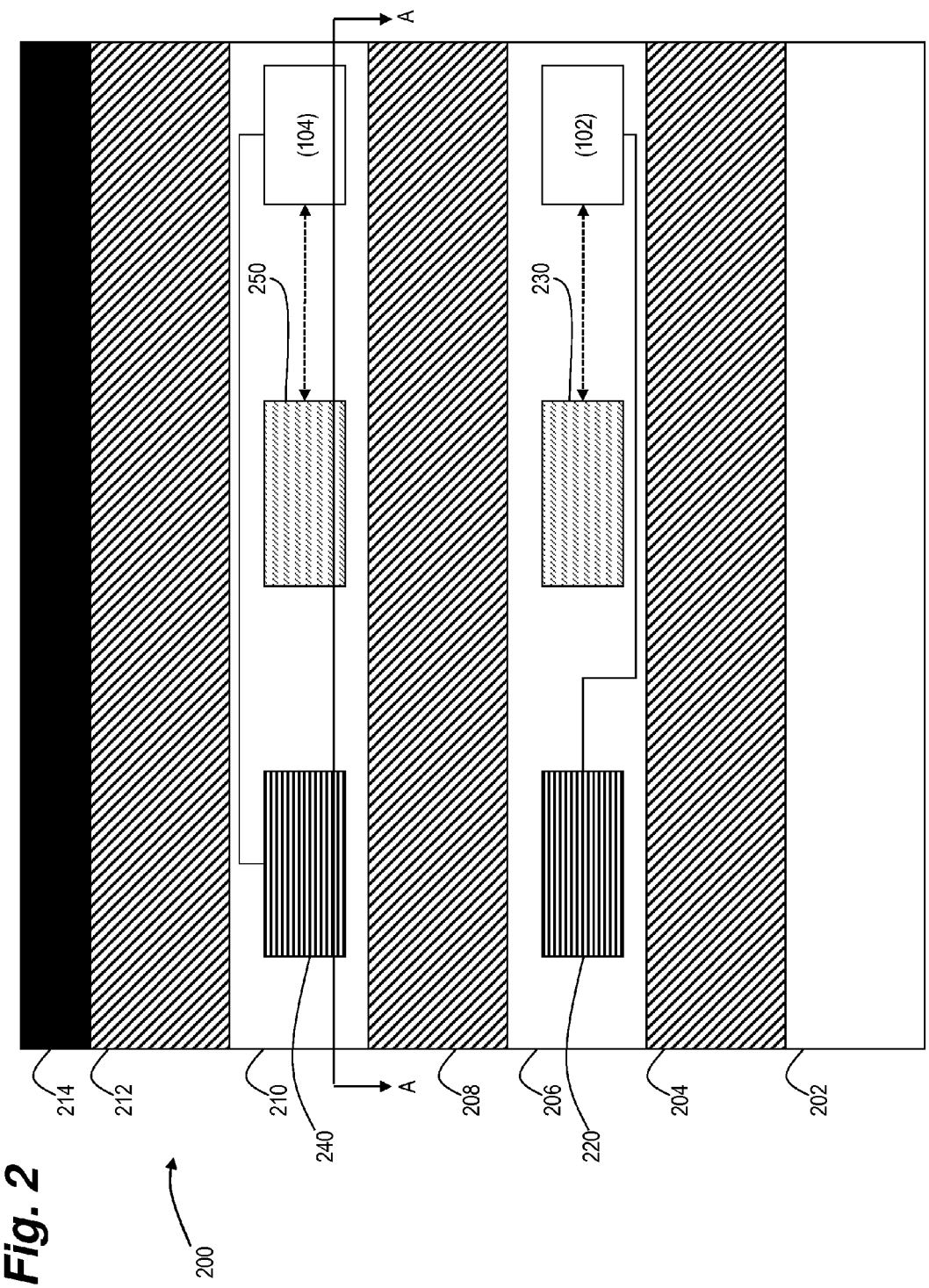
FIG. 2 is a cross sectional diagram of a semiconductor device utilized by embodiments herein.

FIG. 2 is a cross sectional diagram of a semiconductor device 200 including one embodiment herein. Semiconductor layer 202 includes a substrate layer or, in the alternative, a layer with active semiconductor components (semiconductor components such as logic circuits, transistors, etc., that switch electrical states to perform logic functions). An insulating layer 204 is above and in contact with layer 202. Semiconductor layer 206 includes a layer with active semiconductor components therein, and similarly semiconductor layer 210 includes a layer with additionally active semiconductor components therein. Insulating layers 208 and 212 are between and in contact with semiconductor layers 206 and 210. A metal layer or interconnect layer 214 resides above the insulator layers 204, 208 and 212, and the layers with active semiconductor components, 206 and 210.

Active semiconductor layer 206 includes a heating element (such as a resistor, highly resistive material, etc.) 220 and a temperature monitoring element 230. For details about temperature monitors and temperature monitoring processes for integrated circuits, see U.S. Pat. No. 6,662,136, which is incorporated herein by reference. The heating element 220 receives a voltage V, (see FIG. 1), from the kernel circuit 102 of FIG. 1, and the temperature monitoring element 230 is in communication with the kernel circuit 102 to monitor the temperature proximate the heating element Likewise, active semiconductor layer 210 includes a heating element 240 and a temperature monitoring element 250. The heating element 240 receives a voltage V, (see FIG. 1), from the kernel circuit 104 of FIG. 1, and the temperature monitoring element 250 is in communication with the kernel circuit 104 to monitor the temperature proximate the heating element. Thus, heating elements 220 and 240, temperature monitoring elements 230 and 250 and control circuits 102 and 104 are disposed below the metal layer 214 and between insulating layer 208.

Figure 3:
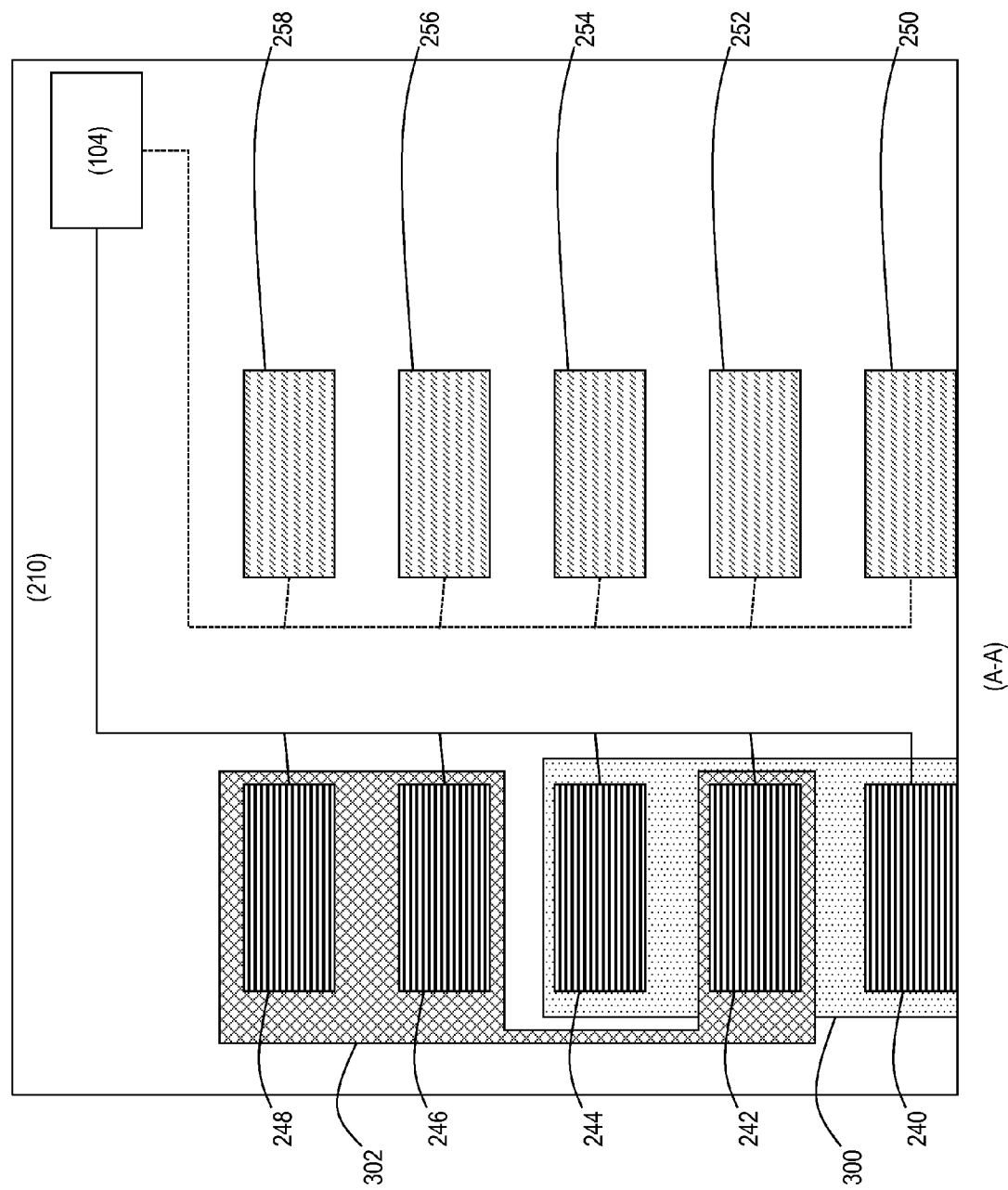
FIG. 3 is a cross sectional diagram of a semiconductor device along line A-A of FIG. 2, utilized by embodiments herein.

FIG. 3 is a cross sectional diagram of the semiconductor device along line A-A of FIG. 2. Active semiconductor layer 210 in this embodiment includes five heating elements 240, 242, 244, 246 and 248 supplied with a voltage V from kernel circuit 104, and five temperature monitoring elements 250, 252, 254, 256 and 258 in communication with kernel circuit 104 (although, as would be understood by those ordinarily skilled in the art, any number of such units could be utilized by embodiments herein). In one embodiment, a group of heating elements in a first heating zone 300 includes heating elements 240, 242 and 244 that are controlled simultaneously by kernel circuit 104 to simulate a heat generating component of a semiconductor circuit design. Another embodiment includes a second heating zone 302 including heating elements 242, 246 and 248 that are controlled simultaneously by the kernel circuit 104 to simulate a different heat generating component of a semiconductor circuit design. An alternative embodiment may provide a second heating zone on a different layer from where the first heating zone is located. An alternative embodiment may also provide a single heating zone that may span more than one semiconductor layer and be controlled by a single voltage kernel circuit.

Another embodiment includes zones controlled by kernel circuits that include heating elements of different semiconductor layers to simulate multi-layer heat generating components or combinations of heat generating components on different layers having similar simulating characteristics. Thus, the embodiments herein present a semiconductor test device that contains circuitry and heater design schemes that mimic field thermal mini-cycles in various geometries and structural configurations.

Another embodiment may include failure monitors that detect an electrical or a mechanical failure for electrical interconnections or components subject to high mechanical stress due to thermal loading characteristics. This electrical or mechanical failure monitor 104 may be connected to a failure control circuit in the same manner that the thermal monitor is connected to the kernel control circuit, and may be used in addition to the thermal monitor. The failure monitors may be distributed by either a via chain structure, a daisy chain structure, or a serpentine structure on the test device to detect electrical or mechanical failure due to stress.

The embodiments presented herein facilitate a flexible test design that allows for a wide range of test temperature delta, test frequencies and test duration of thermal cycles. Additionally, the embodiments presented herein allow for heat generation within specific layers of the test device resulting in a more realistic test device to represent conditions in a production design. The test design may be implemented in Si semiconductor devices and Si compound layers such as SiGe and GaAs semiconductor devices.

An embodiment presented herein includes a semiconductor test device 200 having a plurality of layers 202-212, where each of the layers may be integrated circuit devices, e.g., 206, 210. A plurality of heat generating structures 220, 240 may be sized and positioned within the semiconductor test device 200 to only heat a predetermined limited area 300, 302 of the layers, e.g., 204-212. A plurality of thermal monitors 230, 250 may be positioned within each of the plurality of layers 206, 210 and a control unit 102, 104 may be operatively connected to the heat generating structures 220, 240 and the thermal monitors 230, 250.

Other embodiments herein include where the control unit 104 selectively activates a predetermined pattern 300, 302 of the heat generating structures 240-248 to selectively create hot spots within the layers, e.g., 210. The heat generating structures 240-248 may include at least one individually controllable power dissipation element, e.g., a resistor or a transistor, (not shown, but may reside in control unit 104), and at least one transistor connected to the power dissipation element (not shown, but may reside in control unit 104), where the transistor controls whether the power dissipation elements generates heat. Each of the thermal monitors 250-258, may be sized and positioned within the semiconductor test device 200 to only detect temperatures of a second predetermined limited area of the layers, e.g., 300 or 302, where the second predetermined area corresponds to the predetermined area, e.g., 300 or 302, such that each of the heat generating structures 240-248 has a corresponding thermal monitor 250-258. A plurality of second monitors (not shown) like monitors 250-258, may be positioned within each of the layers 206, 210 to detect one of electrical and mechanical failure, wherein the control unit 104 is additionally operatively connected to the plurality of second monitors.

Another embodiment presented herein includes a semiconductor test device including a plurality of conductive layers 206, 210, where each of the layers includes integrated circuit devices, and a plurality of insulating layers 204, 208, 212 between the conductive layers 206, 210. A plurality of heat generating structures 220, 240-248 may be positioned between the insulating layers and the conductive layers, and each of the heat generating structures may be sized and positioned to only heat a predetermined limited area 300, 302 of the plurality of layers. A plurality of thermal monitors 230, 250-258 may be positioned within each of the layers, where a control unit 102, 104 may be operatively connected to the heat generating structures and the thermal monitors.

Other embodiments herein may include a semiconductor test device including a plurality of conductive layers 206, 210, where each of the layers includes integrated circuit devices and a plurality of insulating layers 204, 208, 212 between the conductive layers. A plurality of heat generating structures 220, 240-248 may be positioned between the insulating layers and the conductive layers, where each of the heat generating structures may be sized and positioned to only heat a predetermined limited area 300, 302 of the plurality of layers. A plurality of thermal monitors 230, 250-258 may be positioned within each of the plurality of layers, and a control unit 102, 104 may be operatively connected to the heat generating structures and the thermal monitors. The control unit 102, 104 individually cycles the heat generating structures on and off for multiple heat cycles, such that different area, e.g., 300, 302, of the layers are treated to different heat cycles.

In other embodiments herein, the different areas, (e.g., 300, 302) of the layers may reside in different locations on a single layer, as shown in FIG. 3, and the different areas of the layers may reside in different layers, (e.g., 206, 210, not shown). Note that the cross section of FIG. 3 along lines A-A in conductive layer 210 may also be incorporated into conductive layer 206, and/or any other conductive layer, where any geometry of predetermined heating areas, e.g., 300, 302 of FIG. 3 may be incorporated therein.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of any embodiments herein. As used herein, the singular forms 'a', 'an' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments herein has been presented for purposes of illustration and description, but is not intended to be exhaustive or limited to the embodiments herein in the form disclosed. Many modifications and variations will be apparent to those of ordinary skill in the art without departing from the scope and spirit of the embodiments herein. The embodiment was chosen and described in order to best explain the principles of the embodiments herein and the practical application, and to enable others of ordinary skill in the art to understand the embodiments herein for various embodiments with various modifications as are suited to the particular use contemplated.

What is claimed is:

1. A semiconductor test device comprising:
   a plurality of layers, each of said layers comprising integrated circuit devices;
   a plurality of heat generating structures, each of said heat generating structures being sized and positioned within said semiconductor test device to only heat a predetermined limited area of said layers;
   a plurality of thermal monitors positioned within each of said plurality of layers; and
   a control unit operatively connected to said heat generating structures and said thermal monitors.

2. The semiconductor test device according to claim 1, said control unit selectively activating a predetermined pattern of said heat generating structures to selectively create hot spots within said layers.

3. The semiconductor test device according to claim 1, said heat generating structures comprising:
   at least one individually controllable power dissipation element; and
   at least one transistor connected to said power dissipation element,
   said transistor controlling whether said power dissipation element generates heat, and
   said power dissipation element comprising one of a resistor and a transistor.

4. The semiconductor test device according to claim 1, each of said thermal monitors being sized and positioned within said semiconductor test device to only detect temperatures of a second predetermined limited area of said layers.

5. The semiconductor test device according to claim 4, said second predetermined area corresponding to said predetermined area, such that each of said heat generating structures has a corresponding thermal monitor.

6. The semiconductor test device according to claim 1, further comprising:
   a plurality of second monitors positioned within each of said layers to detect one of electrical and mechanical failure,
   wherein said control unit operatively connected to said plurality of second monitors.

7. A semiconductor test device comprising:
   a plurality of conductive layers, each of said layers comprising integrated circuit devices;
   a plurality of insulating layers between said conductive layers;
   a plurality of heat generating structures positioned between said insulating layers and said conductive layers, each of said heat generating structures being sized and positioned to only heat a predetermined limited area of said plurality of layers;
   a plurality of thermal monitors positioned within each of said layers; and a control unit operatively connected to said heat generating structures and said thermal monitors.

8. The semiconductor test device according to claim 7, said control unit selectively activating a predetermined pattern of said heat generating structures to selectively create one of hot spots and hot zones within said layers.

9. The semiconductor test device according to claim 7, said heat generating structures comprising:
- at least one individually controllable power dissipation element; and
- at least one transistor connected to said power dissipation element,
- said transistor controlling whether said power dissipation element generates heat, and
- said power dissipation element comprising one of a resistor and a transistor.

10. The semiconductor test device according to claim 7, each of said thermal monitors being sized and positioned within said semiconductor test device to only detect temperatures of a second predetermined limited area of said layers.

11. The semiconductor test device according to claim 10, said second predetermined area corresponding to said predetermined area, such that each of said heat generating structures has a corresponding thermal monitor.

12. The semiconductor test device according to claim 7, further comprising:
- a plurality of second monitors positioned within each of said layers to detect one of electrical and mechanical failure,
- wherein said control unit operatively connected to said plurality of second monitors.

13. A semiconductor test device comprising:
- a plurality of conductive layers, each of said layers comprising integrated circuit devices;
- a plurality of insulating layers between said conductive layers;
- a plurality of heat generating structures positioned between said insulating layers and said conductive layers, each of said heat generating structures being sized and positioned to only heat a predetermined limited area of said plurality of layers;
- a plurality of thermal monitors positioned within each of said plurality of layers; and
- a control unit operatively connected to said heat generating structures and said thermal monitors, said control unit individually cycling said heat generating structures on and off for multiple heat cycles, such that different areas of said layers are treated to different heat cycles.

14. The semiconductor test device according to claim 13, said control unit selectively activating a predetermined pattern of said heat generating structures to selectively create one of thermal hot spots and hot zones within said layers.

15. The semiconductor test device according to claim 13, said heat generating structures comprising:
- at least one individually controllable power dissipation element; and
- at least one transistor connected to said power dissipation element,
- said transistor controlling whether said power dissipation element generates heat, and
- said power dissipation element comprising one of a resistor and a transistor.

16. The semiconductor test device according to claim 13, each of said thermal monitors being sized and positioned within said semiconductor test device to only detect temperatures of a second predetermined limited area of said layers.

17. The semiconductor test device according to claim 16, said second predetermined area corresponding to said predetermined area, such that each of said heat generating structures has a corresponding thermal monitor.

18. The semiconductor test device according to claim 13, further comprising:
- a plurality of second monitors positioned within each of said layers to detect one of electrical and mechanical failure,
- wherein said control unit operatively connected to said plurality of second monitors.

19. The semiconductor test device according to claim 13, wherein said different areas of said layers reside in different locations on a single layer.

20. The semiconductor test device according to claim 13, wherein said different areas of said layers reside in different layers.

* * * * *